(12) United States Patent
Naviasky et al.

(10) Patent No.: US 7,627,072 B2
(45) Date of Patent: Dec. 1, 2009

(54) FREQUENCY-TO-CURRENT CONVERTER

(75) Inventors: Eric Naviasky, Ellicott City, MD (US); Michelle Williams, Laurel, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 567 days.

(21) Appl. No.: 11/387,564

(22) Filed: Mar. 22, 2006

(65) Prior Publication Data

US 2007/0172013 A1   Jul. 26, 2007

Related U.S. Application Data

(63) Continuation-in-part of application No. 11/339,077, filed on Jan. 24, 2006.

(51) Int. Cl.
*H03D 3/24* (2006.01)
(52) U.S. Cl. .................. 375/376; 375/215; 375/294; 375/373; 375/375
(58) Field of Classification Search ............. 375/376, 375/215, 294, 373, 375
See application file for complete search history.

(56) References Cited

U.S. PATENT DOCUMENTS

| 4,598,251 | A | 7/1986 | Wehrs |
| 5,933,058 | A | 8/1999 | Pinto et al. |
| 6,798,372 | B1 | 9/2004 | Yang et al. |
| 2004/0196171 | A1* | 10/2004 | Yang et al. .................. 341/157 |

* cited by examiner

*Primary Examiner*—Shuwang Liu
*Assistant Examiner*—Kabir A Timory
(74) *Attorney, Agent, or Firm*—The Webb Law Firm

(57) ABSTRACT

A frequency-to-current converter includes a digitally selectable capacitor, a sampling capacitor, an integrator circuit and an output transconductor. The sampling capacitor is operatively coupled via a first switch to the digitally selectable capacitor. The first switch is operated by a first clock pulse from a clock generator responsive to a reference clock. The integrator circuit has an output operatively coupled via a second switch to the sampling capacitor. The integrator circuit has an output operatively coupled to a control terminal of the transistor. The second switch is operated by a second, non-overlapping clock pulse from the clock generator. A current output by the frequency-to-current converter in response to the continuous question of first and second switches is linearly proportional to the frequency of the reference clock and the capacitance of the digitally selectable capacitor.

25 Claims, 9 Drawing Sheets

MATCH TO A-A ON SHEET 4 OF 9

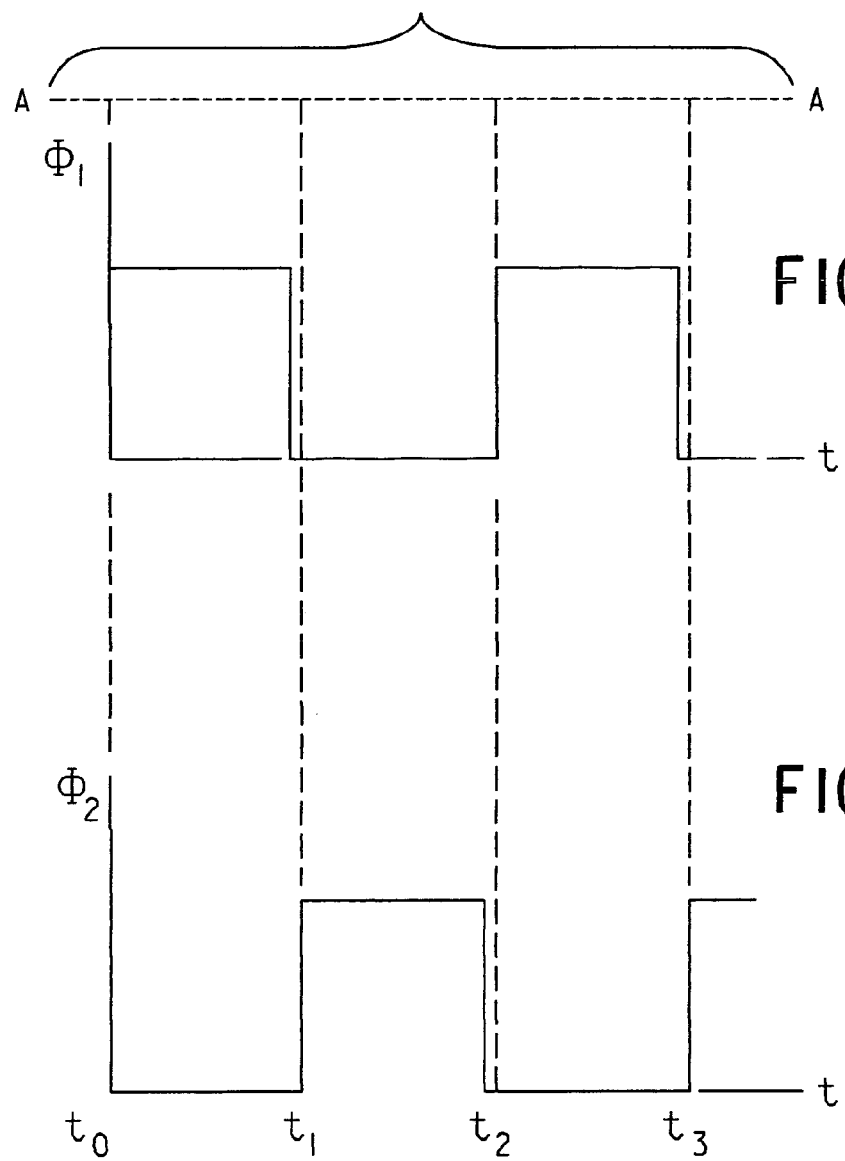

FREQUENCY-TO-CURRENT CONVERTER

CROSS REFERENCE TO RELATED APPLICATIONS

This application is a continuation-in-part of U.S. patent application Ser. No. 11/339,077, filed on Jan. 24, 2006, entitled "An Improved Wideband Phase-Locked Loop with Adaptive Frequency Response that Tracks a Reference," filed on Jan. 24, 2006, which is hereby incorporated by reference.

BACKGROUND OF THE INVENTION

1. Field of the Invention

The present invention relates to electronic circuits and, more particularly, to electronic circuits for frequency to current conversion.

2. Description of Related Art

Frequency-to-voltage and frequency-to-current converters can be employed in numerous types of applications. In particular, frequency-to-current converters will be important building blocks that are widely used in a variety of applications. Two such applications are phase-locked-loops (PLLs) and analog-to-digital converters (ADCs). A PLL is an electronic circuit that controls an oscillator so that it maintains a constant phase angle on the frequency of an input, or reference, signal. A PLL ensures that a signal is locked on a specific frequency and phase and can also be used to generate, modulate and demodulate a signal or multiply a frequency. An ADC is a device that converts analog signals into digital signals. Applications such as ADCs, can utilize features such as an adaptive bias current, which enable analog-to-digital conversion while saving power consumption. Tools such as a frequency-to-current converter may be employed in such applications to supply an adaptive bias current.

Standard implementations of frequency-to-current converters, however, are inadequate to such tasks. Frequency-to-current converters are often implemented by coupling a frequency-to-voltage converter to a voltage-to-current converter. Many conventional frequency-to-voltage and voltage-to-current converters are well known in the art. This combination of circuits, however, is often inadequate because such combinations are complicated to be embedded in a single integrated circuit, and demand a very large silicon area. Circuits such as these in many instances also require the use of a buffer to avoid disturbing the reference frequency.

Some other frequency-to-current converters require the counting of the number of pulses over a fixed period of time. Additional designs require low pass filtering fixed duration pulses at a rate set by an input frequency. Designs such as these are unsuitable for low frequency applications because they produce an output that is usually affected by AC ripple components and also uses a time-consuming averaging process. Furthermore, such designs are based on complex circuits that consume a large amount of power.

Another current frequency-to-current converter design is based on a non-linear analog circuit where the input signal frequency information is extracted through a differentiator and an integrator. However, although such a circuit has a fast response time to input frequency changes, it demands extremely precise differentiators and integrators. A phase mismatch between the differentiator and the integrator can create a large spike at the output.

Accordingly, a need exists for a frequency-to-current converter with reduced complexity, a fast start-up time, a very small area requiring little silicon for integration and low AC ripple output current. A further need exists for a frequency-to-current converter that can be easily incorporated into integrated CMOS mixed signal applications such as PLLs and ADC's.

SUMMARY OF THE INVENTION

The present invention is a frequency-to-current converter for converting a clock frequency to an output current including a digitally selectable capacitor, a sampling capacitor, an integrator circuit and a transistor. The sampling capacitor is operatively coupled via a first switch to the digitally selectable capacitor. The first switch is operated by a first clock pulse from a clock generator responsive to a reference clock. The integrator circuit is operatively coupled via a second switch to the sampling capacitor. The integrator circuit is also operatively coupled to the gate of the transistor, used as one implementation of a transconductor. The second switch is operated by a second clock pulse from a clock generator coupled to a reference clock. A current output of the frequency-to-current converter is linearly proportional to a frequency of the reference clock and a capacitance of the digitally selectable capacitor.

The integrator circuit may include an operational amplifier, a feedback capacitor coupled to the inverting input of the operational amplifier and to the output of the operational amplifier, and a reference voltage coupled to a noninverting input of the operational amplifier. The sampling capacitor may be operatively coupled via the second switch to the inverting input of the operational amplifier, and the transistor may be operatively coupled to the output of the operational amplifier.

The first clock pulse and the second clock pulse may be non-overlapping and are generated by dividing a frequency of the reference clock by two. The digitally selectable capacitor and the sampling capacitor may be charged to a first voltage during the first clock pulse, and the digitally selectable capacitor may be reset during the second clock pulse.

The frequency-to-current converter of the present invention may be realized as part of a CMOS integrated circuit.

The present invention is further directed to an integrated circuit device utilizing a frequency-to-current converter as described above. The integrated circuit device may be a phase-locked-loop or an analog-to-digital converter.

The present invention is also a method of generating a current that is linearly proportional to a frequency of a reference clock. The method includes providing a frequency-to-current converter as described above, inputting a value for the digitally selectable capacitor and producing a current at a drain of the transistor that is linearly proportional to a frequency of the reference clock and a capacitance of the digitally selectable capacitor.

The present invention is further directed to a method of generating a current that is linearly proportional a frequency of a reference clock comprising charging a selectable capacitor to a known voltage using a feedback controlled current source and producing a low AC ripple output current proportional to the frequency of the reference clock and a capacitance of the digitally selectable capacitor.

These and other features and characteristics of the present invention will become more apparent upon consideration of the following description and the appended claims with reference to the accompanying drawings, all of which form a part of this specification. It is to be expressly understood, however, that the drawings are for the purpose of illustration and description only and are not intended as a definition of the limits of the invention. As used in the specification and the claims, the singular form of "a", "an", and "the" include plural referents unless the context clearly dictates otherwise.

BRIEF DESCRIPTION OF THE DRAWINGS

FIGS. 3C and 3D are graphs illustrating exemplary first and second clock pulses output by the clock circuit of FIG. 1B;

DETAILED DESCRIPTION OF THE PRESENT INVENTION

The present invention will be described with reference to the accompanying figures where like reference numbers correspond to like elements.

The frequency-to-current converter of the present invention is designed for use in CMOS mixed-signal applications including, but not limited to, phase-locked loops (PLLs) and analog-to-digital converters. The frequency-to-current converter is designed with reduced complexity, requires a very small silicon area for integration, has a fast start-up time and low AC-ripple output current. Conventional frequency-to-current converter circuits produce an AC-ripple output current that has a value of approximately 1.5 µA peak-to-peak. The present invention provides a much lower AC-ripple output current of approximately 0.05 µA peak-to-peak, for example 0.0329 µA peak-to-peak.

Figure 1A:
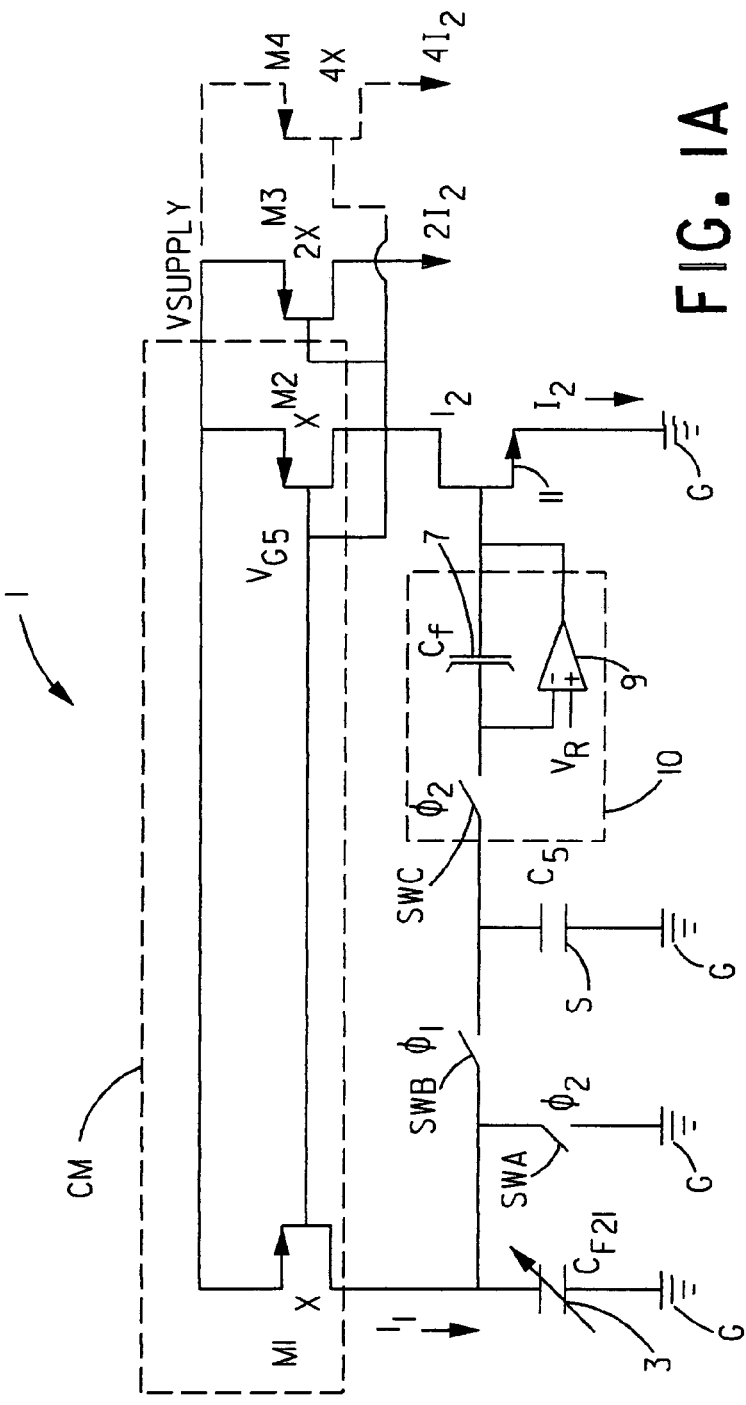
FIG. 1A is a schematic circuit diagram of a frequency-to-current converter in accordance with the present invention.

With reference to FIG. 1A, a frequency-to-current converter 1 in accordance with the present invention includes a digitally selectable capacitor $C_{F2I}$ 3, a sampling capacitor $C_s$ 5 and a feedback capacitor $C_f$ 7. Feedback capacitor $C_f$ 7 is coupled between an output and an inverting input of an operational amplifier 9, and a reference voltage $V_R$ is coupled to a noninverting input of operational amplifier 9. Feedback capacitor $C_f$ 7 and operational amplifier 9 form a sample-mode or switched capacitor integrator 10. The details of such integrators are well-known in the art as described in "Potential of MOS Technologies for Analog Integrated Circuits" by Hodges et al., IEEE Journal of Solid State Circuits, Vol. SC-13, No. 3, June 1978, pp. 285-294.

Digitally selectable capacitor $C_{F2I}$ 3 has a first terminal coupled to a ground reference G and a second terminal coupled to a switch SWA that is operative for connecting the second terminal of digitally selectable capacitor $C_{F2I}$ 3 to ground reference G. Sampling capacitor $C_s$ 5 has a first terminal connected to ground reference G and a second terminal coupled to a switch SWB that is operative for coupling the second terminal of sampling capacitor $C_s$ 5 to the second terminal of digitally selectable capacitor $C_{F2I}$ 3. A switch SWC is also coupled to the second terminal of sampling capacitor $C_s$ 5. Switch SWC is operative for connecting the second terminal of sampling capacitor $C_s$ 5 to the inverting input of operational amplifier 9.

Frequency-to-current converter 1 further includes a transconductor operatively coupled to operational amplifier 9. The transconductor may be an n-channel MOSFET transistor 11 with its gate operatively coupled to the output of operational amplifier 9, its source coupled to ground reference G and its drain coupled to, among other things, a current mirror circuit CM. Current mirror circuit CM includes p-channel MOSFET transistors M1 and M2 each with a size x. The operation of current mirror circuit CM will be discussed in greater detail hereinafter. Additional p-channel MOSFET transistors M3 and/or M4 (shown in phantom) may be connected as desired or needed with the gates and sources of transistors M3 and/or M4 connected in parallel to the gate and source of transistor M2 in order to obtain a usable output current from the circuit. Transistors M3 and M4 may vary in size with transistors M1 and M2. In the exemplary embodiment of FIG. 1A, transistors M3 and M4 are shown as having sizes 2× and 4× respectively. However, this is not to be construed as limiting the present invention as transistors M3 and M4 have been envisioned as having sizes that are greater than, less than or equal to transistors M1 and M2 depending on the application.

Figure 1B:
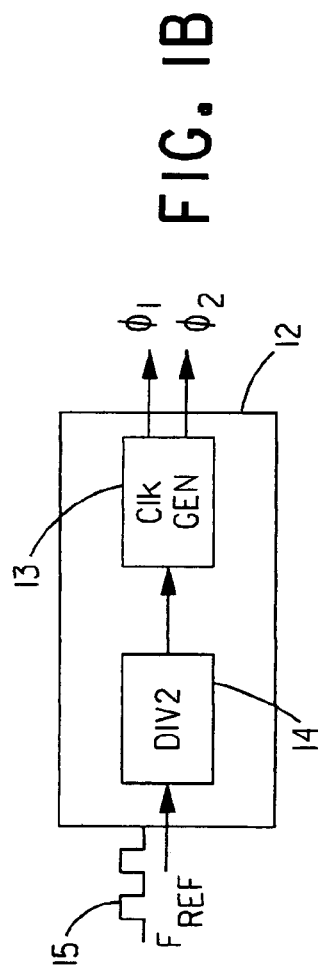
FIG. 1B is a schematic circuit diagram of an exemplary clock circuit for use with the frequency-to-current converter of FIG. 1A.

With reference to FIG. 1B and with continuing reference to FIG. 1A, switches SWA, SWB and SWC are operated by non-overlapping clock pulses $\Phi_1$ and $\Phi_2$ output by a clock circuit 12, with switch SWB closing in response to clock pulse $\Phi_1$, with switches SWA and SWC closing in response to clock pulse $\Phi_2$. Clock circuit 12 includes a clock generator 13 and a frequency divider 14 that receives input from an externally generated reference clock signal 15 that operates at a frequency of $F_{REF}$. The frequency $F_{REF}$ of reference clock signal 15 is divided by two by frequency divider 14 and output to clock generator 13 which produces non-overlapping first and second clock pulses $\Phi_1$ and $\Phi_2$, respectively, therefrom. The division of the frequency $F_{REF}$ of reference clock signal 15 by two allows the frequency-to-current converter to be insensitive to a clock duty cycle. The frequency $F_{REF}$ of reference clock signal 15 may be between 10 kHz and 1 GHz, for example between 30 kHz and 250 MHz thereby producing on times and off times for switches SWA, SWB and SWC that are between 100 µs and 1 ns, for example 30 µs and 4 ns.

Figure 2:
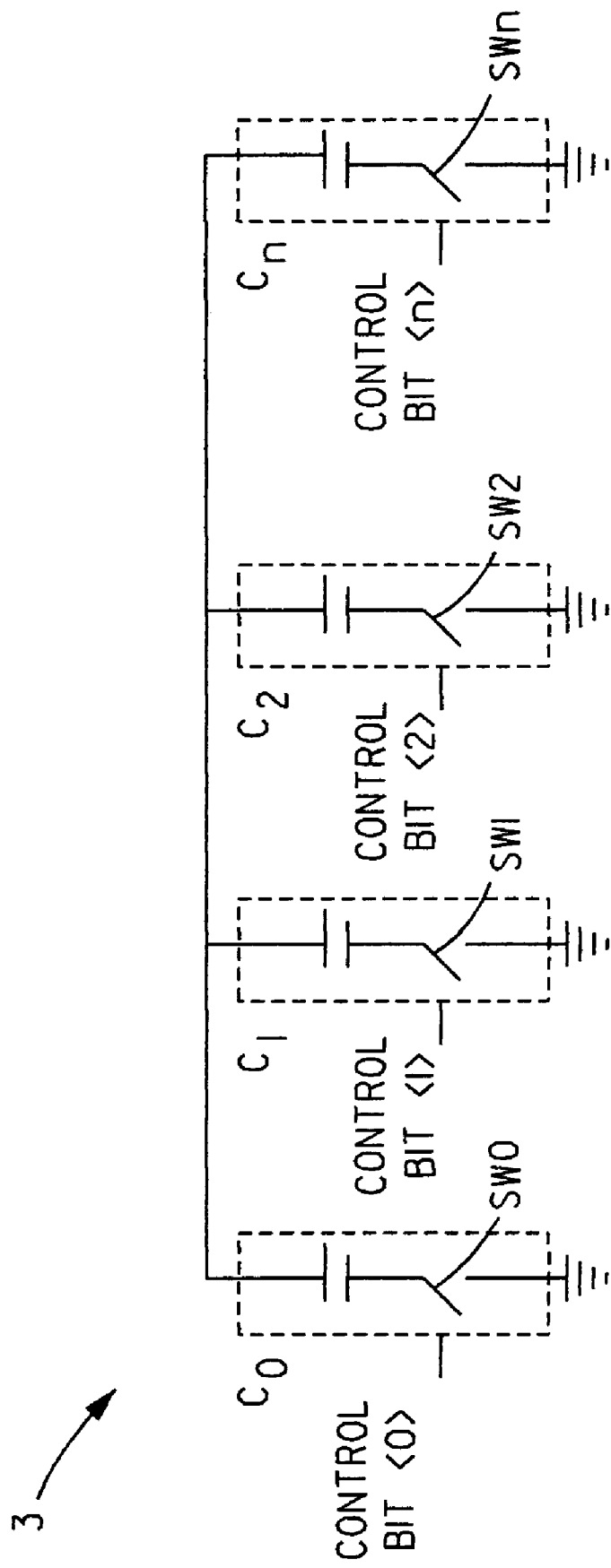
FIG. 2 is a schematic circuit diagram of an exemplary embodiment of a digitally selectable capacitor of the frequency-to-current converter of FIG. 1A.

With reference to FIG. 2 and with continuing reference to FIGS. 1A and 1B, one exemplary, non-limiting embodiment of digitally selectable capacitor $C_{F2I}$ 3 is comprised of a plurality of capacitors, e.g., without limitation, $C_0$, $C_1$, $C_2 \ldots C_n$, connected in parallel, with each capacitor connected to a switch, e.g., SW0, SW1, SW2 ... SWn, respectively. Each switch operates under the control of an externally generated control bit set by, for example, a microprocessor, a digital signal processor, and the like. For example, if control bits <2,1,0> are set to 111 (assuming a positive logic convention is being used), then capacitors $C_2$, $C_1$ and $C_0$ are selected whereupon the total capacitance of digitally selectable capacitor $C_{F2I}$ 3 is equal to $C_2+C_1+C_0$. Similarly, if control bits <2,1,0> are set to 001, then only capacitor $C_0$ is selected whereupon the total capacitance of digitally selectable capacitor $C_{F2I}$ 3 is equal to only the capacitance of capacitor $C_0$. It is envisioned that digitally selected capacitor $C_{F2I}$ 3 can have any suitable or desirable number of parallel capacitors deemed useful and/or necessary by one of ordinary skill in the art.

With reference to FIGS. 3A-3D and with continuing reference to FIGS. 1A, 1B and 2, the basic operation of the frequency-to-current converter is to charge both digitally selectable capacitor $C_{F2I}$ 3 and sampling capacitor $C_s$ 5 and then the charge on the sampling capacitor $C_s$ 5 is transferred to integrator 10 during second clock pulse $\Phi_2$.

Figure 3A:
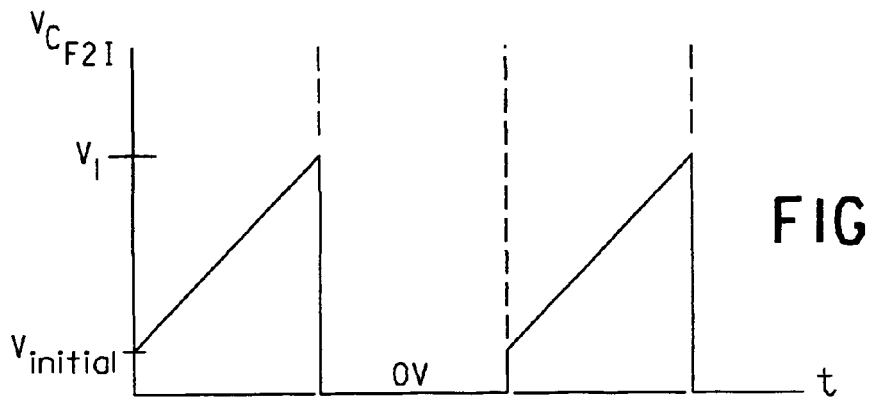
FIG. 3A is a graph of the voltage at the digitally selectable capacitor of the frequency-to-current converter of FIG. 1A versus time.
Figure 3B:
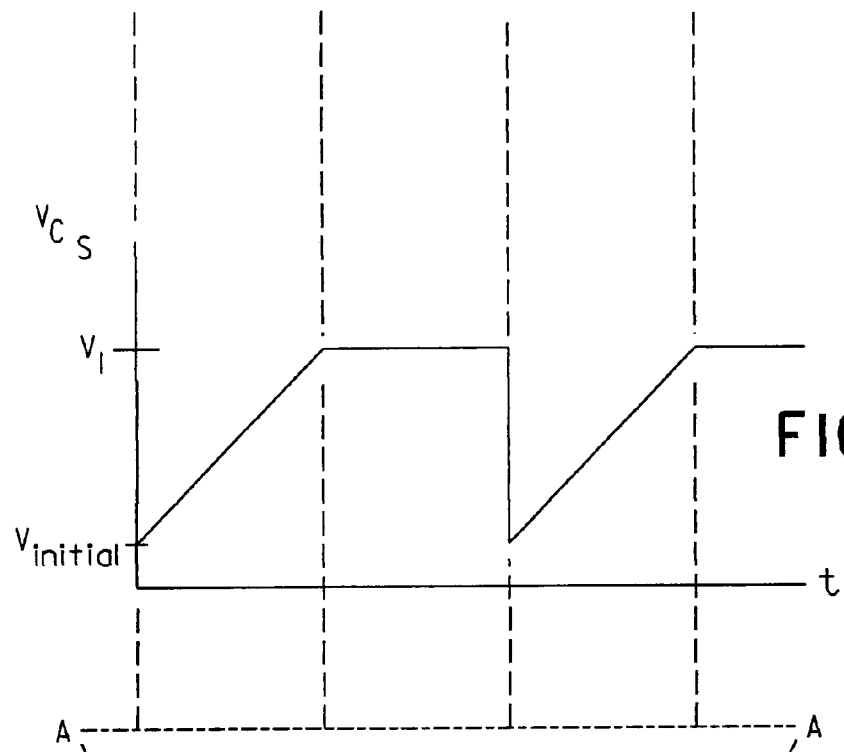
FIG. 3B is a graph of the voltage at a sampling capacitor of the frequency-to-current converter of FIG. 1A versus time.

The detailed operation of frequency-to-current converter 1 is as follows. First, non-overlapping first and second clock pulses $\Phi_1$ and $\Phi_2$, respectively, are output by clock circuit 12, as shown in FIGS. 3C and 3D. During first clock pulse $\Phi_1$ commencing at time $t_0$, switch SWB closes when switches SWA and SWC are open whereupon digitally selectable capacitor $C_{F2I}$ 3 and sampling capacitor $C_s$ 5 charge from an initial voltage $V_{initial}$ (discussed hereinafter) to a first voltage $V_1$, shown in FIGS. 3A and 3B, via a current $I_1$ supplied by transistor $M_I$. Next, during second clock pulse $\Phi_2$ commencing at time $t_1$ switches SWA and SWC are closed when switch SWB is open, whereupon the second terminal of digitally selectable capacitor $C_{F2I}$ 3 is connected to reference ground G through switch SWA, thereby causing the voltage of digitally selectable capacitor $C_{F2I}$ 3 to fall to zero, as shown in FIG. 3A, and sampling capacitor $C_s$ 5 is coupled via switch SWC to the inverting input of operational amplifier 9 leaving the voltage on sampling capacitor $C_s$ 5 at first voltage $V_1$. Then, when first clock pulse $\Phi_1$ commences at time $t_2$, switch SWB closes when switches SWA and SWC are open whereupon sampling capacitor $C_s$ 5 partially discharges into digitally selectable capacitor $C_{F2I}$ 3 thereby causing initial voltage $V_{initial}$ to appear on sampling capacitor $C_s$ 5 and digitally selectable capacitor $C_{F2I}$ 3. This initial voltage $V_{initial}$ can be determined using the following equation:

$$V_{initial} = V_R C_s / (C_s + C_{F2I}) \quad \text{Equation (1)}$$

Then, when second clock pulse $\Phi_2$ commences at time $t_3$, switches SWA and SWC close and switch SWB is opened. If first voltage $V_1$ on sampling capacitor $C_s$ 5 is less than reference voltage $V_R$ applied to the noninverting input of operational amplifier 9, current flows from the output of operational amplifier 9 into feedback capacitor $C_f$ 7 causing the voltage at the output of operational amplifier 9 to increase thereby increasing output current $I_2$ and, thereby, increasing the gate-to-source voltage $V_{GS}$ of transistor M2. By virtue of transistors M1 and M2 being the same and having their gates connected to the drain of transistor 11, current mirror circuit CM provides a charging current $I_1$ that is equal to output current $I_2$ at the source of transistor 11. Therefore, charging current $I_1$ will also increase. The increase in charging current $I_1$ thereby increases the rate of charge accumulation on digitally selectable capacitor $C_{F2I}$ 3 which, in turn, increases the voltage impressed across digitally selectable capacitor $C_{F2I}$ 3 in response to the ongoing switching of switches SWA, SWB and SWC in the above-described manner.

The process of continuously causing switches SWA, SWB and SWC to switch on and off in the above-described manner causes the value of first voltage $V_1$ to increase until it equals reference voltage $V_R$. Once first voltage $V_1$ equals reference voltage $V_R$, steady state is achieved.

Alternatively, if first voltage $V_1$ on sampling capacitor $C_s$ 5 is greater than reference voltage $V_R$ applied to the noninverting input of operational amplifier 9, when second clock pulse $\Phi_2$ commences at time $t_3$, current flows into the output of integrator 10 from feedback capacitor $C_f$ 7 causing the voltage at the output of integrator 10 to decrease thereby decreasing output current $I_2$ and, thereby, decreasing the gate-to-source voltage $V_{GS}$ of transistor M2. By virtue of transistors M1 and M2 being the same and having their gates connected to the drain of transistor 11, current mirror circuit CM provides a charging current $I_1$ that is equal to output current $I_2$ at the source of transistor 11. Therefore, charging current $I_1$ will also decrease. The decrease in charging current $I_1$ thereby decreases the rate of charge accumulation on digitally selectable capacitor $C_{F2I}$ 3 which in turn decreases the voltage unpressed across digitally selectable capacitor $C_{F2I}$ 3 in response to the ongoing switching of switches SWA, SWB, and SWC in the above-described manner.

The process of continuously causing switches SWA, SWB and SWC to switch on and off in the above-described manner causes first voltage $V_1$ to decrease until it equals reference voltage $V_R$. Once first voltage $V_1$ equals reference voltage $V_R$, steady state is achieved.

The governing equation for each of the above described situations, i.e., when first voltage $V_1$ is initially greater than and less than reference voltage $V_R$, is as follows:

$$I_1/F_{REF} = (V_R - V_{initial})(C_s + C_{F2I}) \quad \text{Equation (2)}$$

Furthermore, at this point, the voltage at the gate of transistor 11 and the gate-to-source voltage $V_{GS}$ of transistor M2 are stable.

Substituting Equation (1) into Equation (2), substituting $I_2$ for $I_1$ in Equation (2) and reducing Equation (2) yields the following Equation (3) where it can be seen that output current $I_2$ is proportional to the frequency $F_{REF}$ of reference clock signal 15 and the capacitance of digitally selectable capacitor $C_{F2I}$ 3.

$$I_2 = V_R \cdot C_{F2I} \cdot F_{REF} \quad \text{Equation (3)}$$

Therefore, the value of current $I_2$ can be changed by selecting the value of digitally selectable capacitor $C_{F2I}$ 3 and/or by adjusting the frequency $F_{REF}$ of reference clock signal 15. Once a steady state is achieved, frequency-to-current converter 1 will produce a stable current $I_2$ that is equal to charging current $I_1$.

Returning to FIG. 1a, in order to obtain a usable output from frequency-to-current converter 1, a transistor M3 must be connected with its gate and source voltage equal to the gate and source voltage of transistor M2. Further, transistor M4 (shown in phantom) may be added in with its gate and source voltage equal to the gate and source voltage of transistor M3 to provide an additional output. The drains of transistors M3 and M4 may be connected to an integrated circuit device such as a PLL or an analog-to-digital converter and, thereby, provide a stable reference current to the integrated circuit device. While FIG. 1A illustrates two transistors M3 and M4 connected with their gates and sources in parallel to the gate and source of transistor M2, this is not to be construed as limiting the present invention as the use of one or a plurality of transistors connected to transistor M2 have been envisioned in order to obtain one or a plurality of outputs.

Figure 4:
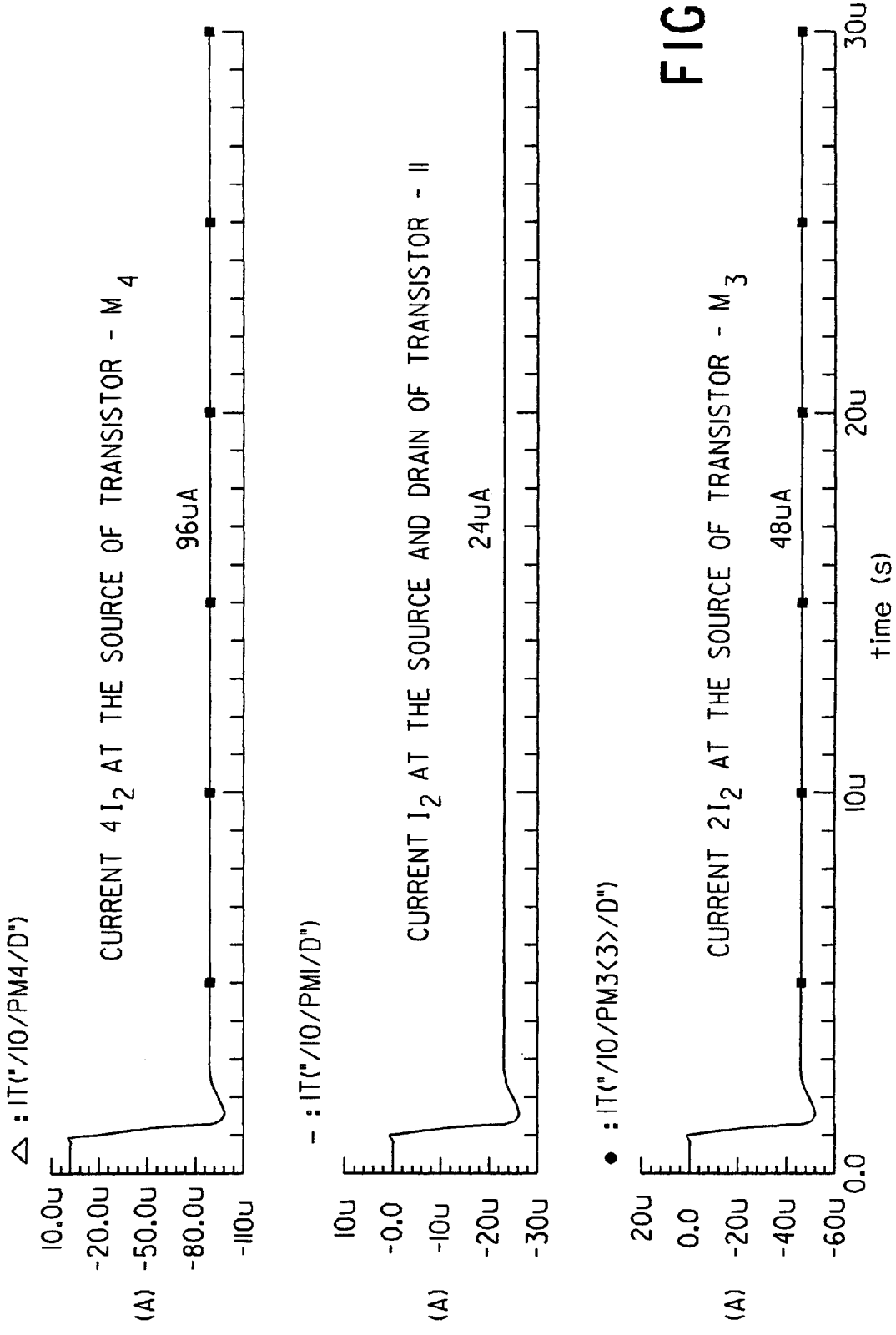
FIG. 4 shows graphs illustrating the relationship between output currents of the frequency-to-current converter of FIG. 1A versus time.

With reference to FIG. 4 and with continuing reference to FIGS. 1A, 1B and 2, graphs of current versus time are illustrated. The middle graph illustrates output current $I_2$ at the drain of transistor 11 versus time. Output current $I_2$ achieves the value governed by Equation (3) above in a very short period of tine (e.g., approximately 3 µs). The top graph illustrates the current ($4I_2$) sent to another device, such as a PLL or an analog-to-digital converter, from transistor M4 versus time. Since transistor M4 is four times the size of transistor M2, transistor M4 supplies four times the current (96 µA versus 24 µA). Finally, the bottom graph illustrates the current ($2I_2$) sent to another device from transistor M3 versus time.

Since transistor M3 is twice the size of transistor M2, transistor M3 supplies twice the current (48 μA versus 24 μA).

As can be seen from the graphs of FIG. 4, the start-up time of frequency-to-current converter 1 is very fast at which point the output current of each transistor M2, M3, and M4 settles to a steady state value.

One of the advantages of frequency-to-current converter 1 is the simplicity of the circuit. This allows frequency-to-current converter 1 to occupy a very small silicon area for integration. Frequency-to-current converter 1 provides an output current that is accurate within ten percent due to capacitor variation, and operates at both low and high frequencies with fast response time. The output current produced by frequency-to-current converter 1 has very low AC ripple. The operation of frequency-to-current converter 1 has a low filtering requirement from integrating capacitor $C_f$ 7 and, therefore, does not require large capacitors or resistors.

Figure 5A:
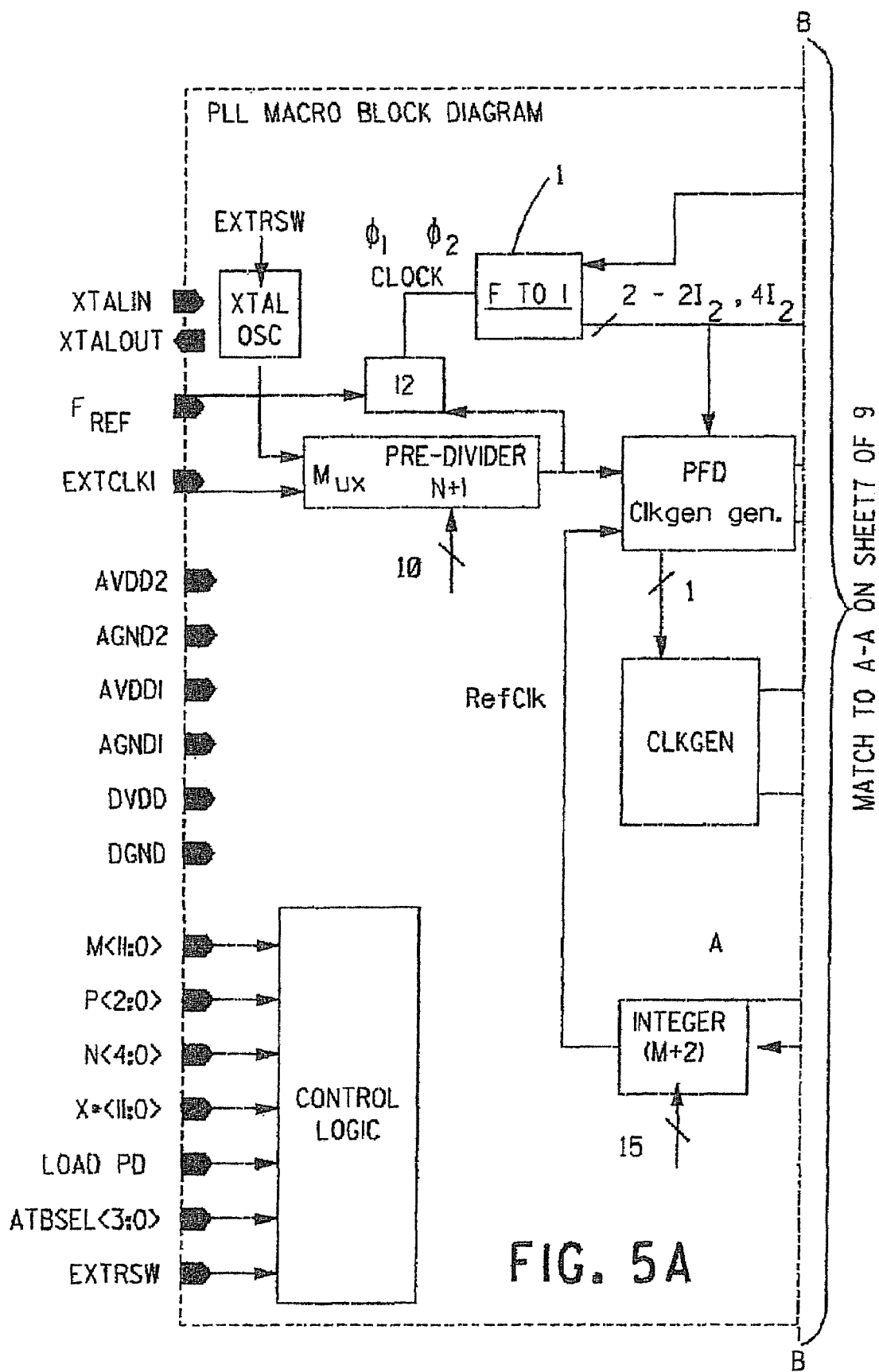
FIGS. 5A-5C are a schematic diagram of a phased-lock loop utilizing a frequency-to-current converter in accordance with the present invention.
Figure 5B:
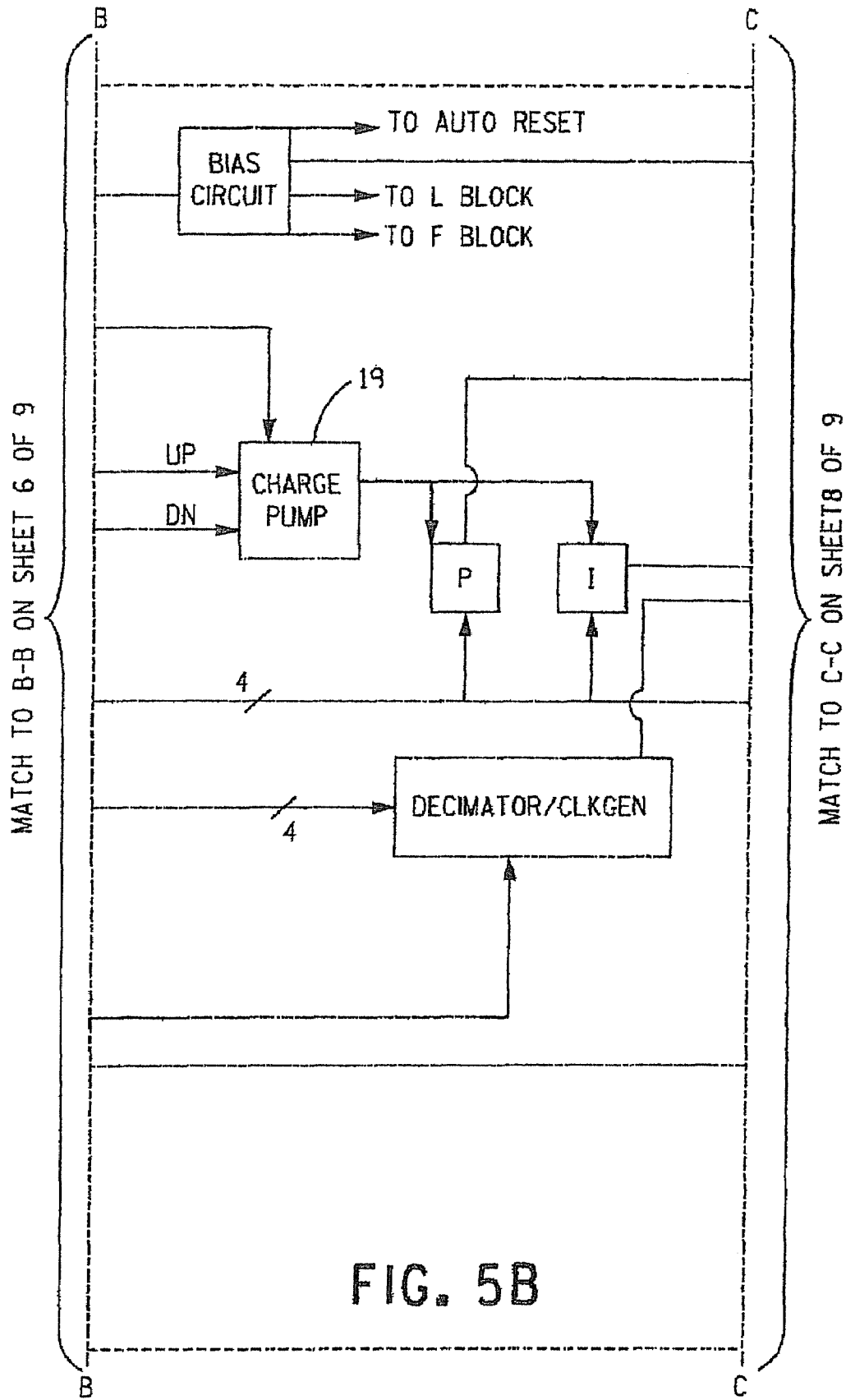
Figure 5C:
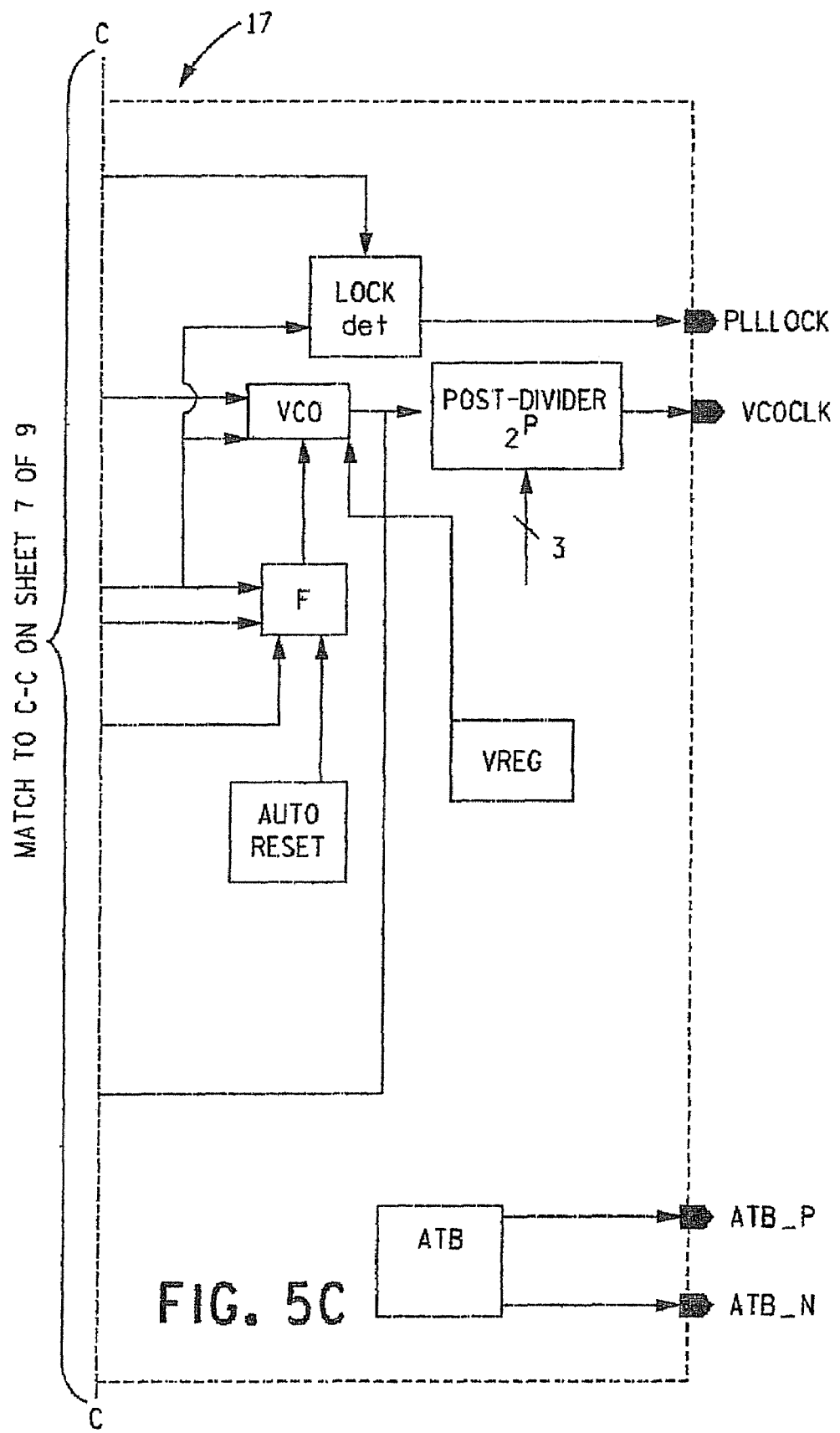

With reference to FIGS. 5A-5C, a high-level schematic diagram of a phase-locked loop (PLL) 17 utilizing the frequency-to-current converter 1 of the present invention is illustrated. Frequency-to-current converter 1 is used to supply a charge pump 19 with a current reference, e.g., $2I_2$. Charge pump 19 is a simple switched mirror type that includes separate outputs for proportion and integral paths.

Figure 6:
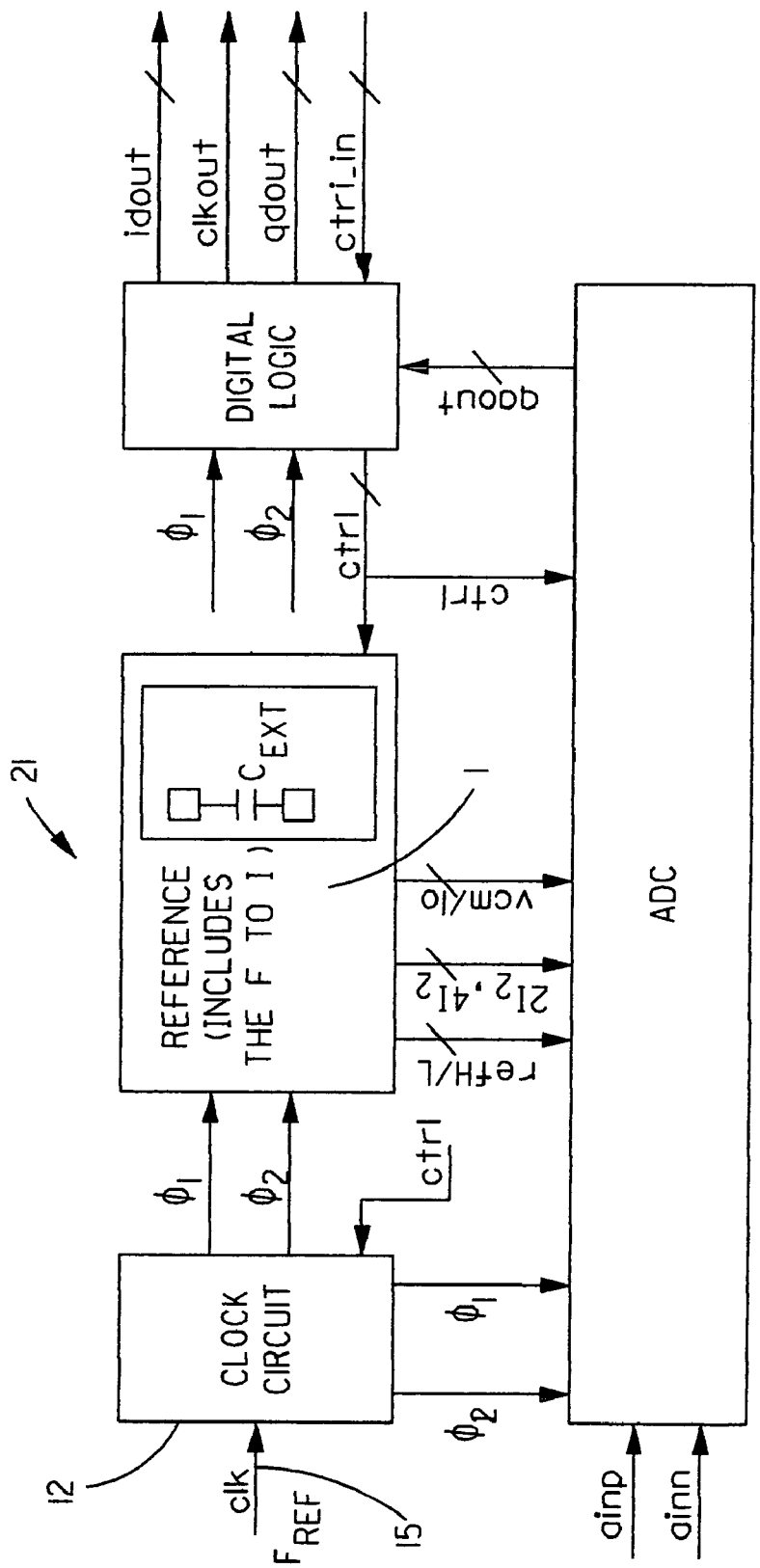
FIG. 6 is a schematic diagram of an analog-to-digital converter utilizing a frequency-to-current converter in accordance with the present invention.

With reference to FIG. 6, a high-level schematic diagram of an analog-digital converter (ADC) 21 utilizing the frequency-to-current converter 1 of the present invention. The frequency-to-current converter 1 changes the current to ADC 21 as the input frequency is changed thereby holding the gain constant. The user of ADC 21 can also or alternatively be provided with the choice of increasing or decreasing the gain by digitally selecting the size of digitally selectable capacitor $C_{F2I}$ which is proportional to the output current $I_2$ of frequency-to-current converter 1.

While the present invention has been described with reference to preferred embodiments of the frequency-to-current converter, those skilled in the art may make modifications and alterations to the present invention without departing from the scope and spirit of the invention. Accordingly, the above detailed description is intended to be is intended to be illustrative rather than restrictive. The invention is defined by the appended claims, and all changes to the invention that fall within the meaning and range of equivalency of the claims are to be embraced by their scope.

The invention claimed is:

1. A frequency-to-current converter for accurately converting a clock frequency to an output current comprising:
    a digitally selectable capacitor having a capacitance value that is digitally selectable;
    a sampling capacitor operatively coupled via a first switch to the digitally selectable capacitor, the first switch operated by a first clock pulse from a clock generator responsive to a reference clock;
    an integrator circuit operatively coupled via a second switch to the sampling capacitor, the second switch operated by a second, non-overlapping clock pulse from the clock generator;
    a current mirror circuit operative for outputting a first current to the digitally selectable capacitor and for outputting a second current; and
    a transconductor operatively coupled to the integrator circuit and the current mirror circuit, the transconductor responsive to a comparison by the integrator circuit of a reference voltage and a voltage impressed on the sampling capacitor that is coupled to the integrator circuit by the second switch for conducting the second current from the current mirror circuit at a value related to the comparison,
    wherein in response to continuous operation of the non-overlapping first and second pulses, the value of the first current to the digitally selectable capacitor is controlled as a function of the value of the second current to cause the voltage impressed on the sampling capacitor to be made equal to the reference voltage, and the output current of the frequency-to-current converter is linearly proportional to a frequency of the reference clock and the capacitance value of the digitally selectable capacitor.

2. The frequency-to-current converter of claim 1, wherein:
    the integrator circuit comprises an operational amplifier, a feedback capacitor coupled to an inverting input of the operational amplifier and to an output of the operational amplifier, and the reference voltage coupled to a noninverting input of the operational amplifier;
    the sampling capacitor is operatively coupled via the second switch to the inverting input of the operational amplifier; and
    the transconductor is operatively coupled to the output of the operational amplifier.

3. The frequency-to-current converter of claim 1, wherein the frequency-to-current converter is realized as part of an integrated circuit.

4. The frequency-to-current converter of claim 3, wherein the integrated circuit is a MOS integrated circuit.

5. The frequency-to-current converter of claim 1, wherein the first clock pulse and the second clock pulse are generated by dividing a frequency of the reference clock by two.

6. The frequency-to-current converter of claim 1, wherein the digitally selectable capacitor and the sampling capacitor are charged to a first voltage during the first clock pulse.

7. The frequency-to-current converter of claim 6, wherein the digitally selectable capacitor is reset during the second clock pulse.

8. The frequency-to-current converter of claim 1, wherein the transconductor is a transistor.

9. A phase-locked-loop comprising the frequency-to-current converter of claim 1.

10. The phase-locked-loop of claim 9:
    wherein the integrator circuit comprises an operational amplifier, a feedback capacitor coupled to an inverting input of the operational amplifier and to an output of the operational amplifier; and the reference voltage coupled to a noninverting input of the operational amplifier;
    the sampling capacitor is operatively coupled via the second switch to the inverting input of the operational amplifier; and
    the transconductor is operatively coupled to the output of the operational amplifier.

11. The phase-locked-loop of claim 9, wherein the phase-locked-loop is realized as an integrated circuit.

12. The phase-locked-loop of claim 11, wherein the integrated circuit is a MOS integrated circuit.

13. The phase-locked-loop of claim 9, wherein the first clock pulse and the second clock pulse are generated by dividing a frequency of the reference clock by two.

14. The phase-locked-loop of claim 13, wherein the first clock pulse and the second clock pulse are non-overlapping.

15. The phase-locked-loop of claim 9, wherein the digitally selectable capacitor and the sampling capacitor are charged to a first voltage during the first clock pulse.

16. The phase-locked-loop of claim 15, wherein the digitally selectable capacitor is reset during the second clock pulse.

17. An analog-to-digital converter comprising the frequency-to-current converter of claim 1.

18. The analog-to-digital converter of claim 17, wherein:
the integrator circuit comprises an operational amplifier, a feedback capacitor coupled to an inverting input of the operational amplifier and to an output of the operational amplifier, and the reference voltage coupled to a noninverting input of the operational amplifier;
the sampling capacitor is operatively coupled via the second switch to the inverting input of the operational amplifier; and
the transconductor is operatively coupled to the output of the operational amplifier.

19. The analog-to-digital converter of claim 17, wherein the analog-to-digital converter is realized as an integrated circuit.

20. The analog-to-digital converter of claim 19, wherein the integrated circuit is a MOS integrated circuit.

21. A method of generating a current that is linearly proportional to a frequency of a reference clock comprising:
charging a selectable capacitor that has a selectable capacitance to a reference voltage using a feedback controlled current source that is responsive to a comparison of the reference voltage to a voltage that is impressed on a sampling capacitor in response to the reference clock controlling a first switch to cause the sampling capacitor to alternately charge from the selectable capacitor and to at least partially discharge and the reference clock controlling a second switch to couple the charged sampling capacitor to an input of an integrator circuit of the feedback controlled current source for the comparison, wherein the feedback controlled current source further includes a transconductor responsive to an output of the integrator circuit, wherein the first and second switches are operated by respective first and second clock pulses responsive to the reference clock; and
producing via the transconductor an output current that is linearly proportional to a frequency of the reference clock and a capacitance of the selectable capacitor.

22. The method of claim 21, wherein the output current has an AC ripple value of less than 0.05 µA peak-to-peak.

23. The method of claim 21, further including selecting a capacitance value of the selectable capacitor.

24. The method of claim 21, wherein the first clock pulse and the second clock pulse are generated by dividing a frequency of the reference clock by two.

25. The method of claim 21, wherein the first clock pulse and the second clock pulse are non-overlapping.

* * * * *